(12) United States Patent
Schumacher et al.

(10) Patent No.: US 7,984,412 B1
(45) Date of Patent: Jul. 19, 2011

(54) IC DESIGN ESTIMATION USING MID-LEVEL ELEMENTS OF IP CORES

(75) Inventors: Paul R. Schumacher, Berthoud, CO (US); Christopher S. Arndt, Erie, CO (US)

(73) Assignee: Xilinx, Inc., San Jose, CA (US)

( * ) Notice: Subject to any disclaimer, the term of this patent is extended or adjusted under 35 U.S.C. 154(b) by 700 days.

(21) Appl. No.: 12/041,150

(22) Filed: Mar. 3, 2008

(51) Int. Cl.
*G06F 17/50* (2006.01)
(52) U.S. Cl. ........................................ 716/136; 716/108
(58) Field of Classification Search .......... 716/101–103, 716/136
See application file for complete search history.

(56) References Cited

U.S. PATENT DOCUMENTS

| | | | |
|---|---|---|---|
| 6,578,174 B2 | 6/2003 | Zizzo | |
| 7,028,283 B1 | 4/2006 | Keller | |
| 7,058,921 B1 | 6/2006 | Hwang et al. | |
| 7,165,229 B1 * | 1/2007 | Gathoo et al. | 716/105 |
| 7,376,929 B1 * | 5/2008 | Grant | 716/117 |
| 7,464,345 B2 | 12/2008 | Martin et al. | |
| 7,631,284 B1 | 12/2009 | Perry et al. | |
| 7,735,050 B2 | 6/2010 | Yu et al. | |
| 7,823,092 B1 | 10/2010 | Perry | |
| 2002/0072893 A1 | 6/2002 | Wilson | |
| 2002/0188910 A1 * | 12/2002 | Zizzo | 716/1 |
| 2005/0183055 A1 | 8/2005 | Herrera | |
| 2007/0028196 A1 | 2/2007 | Martin et al. | |
| 2008/0134127 A1 | 6/2008 | Allen et al. | |

OTHER PUBLICATIONS

U.S. Appl. No. 11/707,616, filed Feb. 16, 2007, Schumacher.
U.S. Appl. No. 12/041,167, filed Mar. 3, 2008, Schumacher et al.
U.S. Appl. No. 12/041,182, filed Mar. 3, 2008, Schumacher et al.
Kulkarni et al., "Fast Area Estimation to Support Compiler Optimizations in FPGA-based Reconfigurable Systems," *Proceedings of the 10th Annual IEEE Symposium on Field-Programmable Custom Computing Machines (FCCM'02)*, Apr. 22-24, 2002, pp. 239-247, Napa, California.
Kulkarni et al., "Compile-Time Area Estimation for LUT-Based FPGAs," *ACM Transactions on Design Automation of Electronic Systems*, Jan. 2006, pp. 1-19, vol. 11, No. 1.
Menn et al., "Controller Estimation for FPGA Target Architectures During High-Level Synthesis," *15th International Symposium on System Synthesis (ISSS'02)*, Oct. 2-4, 2002, pp. 56-61, Kyoto, Japan.
Milder et al., "Fast and Accurate Resource Estimation of Automatically Generated Custom DFT IP Cores," *Proceedings of the 2006 ACM/SIGDA 14th International Symposium on Field Programmable Gate Arrays*, Feb. 22-24, 2006, pp. 211-220, Monterey, California.

(Continued)

*Primary Examiner* — Jack Chiang
*Assistant Examiner* — Binh C Tat
(74) *Attorney, Agent, or Firm* — Scott Hewett; LeRoy D. Maunu; Lois D. Cartier

(57) ABSTRACT

A method (100) of estimating a performance characteristic of an integrated circuit (IC) design having an intellectual property ("IP") core pre-characterizes an element type of the IC design to provide an estimation result of the element type (102-108). Mid-level elements of the IP are acquired (116). A user selects a value of a parameter of the IP core and the IC design is run on a design tool using the estimation result to model the mid-level elements of the IP core (118) to return a performance value of the IC design (120).

18 Claims, 4 Drawing Sheets

OTHER PUBLICATIONS

Xu et al., "ChipEst-FPGA: A Tool for Chip Level area and Timing Estimation of Lookup Table Based FPGAs for High Level Applications," *Proceedings of the ASP-DAC Design Automation Conference 1997*, Jan. 28-31, 1997, pp. 435-440, Chiba, Japan.

Xilinx, Inc., "CORE Generator Guide," Version 4.1i, copyright 1991-2001, pp. 1-170, available from Xilinx, Inc., 2100 Logic Drive, San Jose, California 95124, USA.

Schumacher, Paul et al., "Fast and Accurate Resource Estimation of RTL-Based Designs Targeting FPGAS," *2008 International Conference on Field Programmable Logic and Applications (FPL '08)*, Sep. 8-10, 2008, pp. 59-64, Heidelberg, Germany.

Bilavarn et al., "Fast Prototyping of Reconfigurable Architectures from a C Program," *Proc. of the 2003 International Symposium on Circuits and Systems*, May 25, 2003, pp. V-589 to V-592, vol. 5.

Bilavarn et al., "Area Time Power Estimation for FPGA Based Designs at a Behavioral Level," *Proc. of the 7th IEEE International Conference on Electronics, Circuits, and Systems*, Dec. 17, 2000, pp. 524-527, vol. 1, IEEE, Piscataway, New Jersey, USA.

Bjureus et al., "FPGA Resource and Timing Estimation from Matlab Execution Traces," *Proc. of the 10th International Symposium on Hardware/Software Codesign*, May 6, 2002, pp. 31-36, ACM, New York, New York, USA.

Brandolese et al., "An Area Estimation Methodology for FPGA Based Designs at SystemC-Level," *Proc. of the 41st Annual Conference on Design Automation*, Jun. 7, 2004, pp. 129-132, IEEE Computer Society, Washington, DC, USA.

Dutt et al., "Bridging High-Level Synthesis to RTL Technology Libraries," *Proc. of the 28th ACM/IEEE Automation Conference*, Jun. 17, 1991, pp. 526-529, ACM, New York, New York, USA.

Haldar et al., "A System for Synthesizing Optimized FPGA Hardware from Matlab," *Proc. of the 2001 IEEE/ACM International Conference on Computer Aided Design*, Nov. 4, 2001, pp. 314-319, IEEE, Piscataway, New Jersey, USA.

Jha et al., "Rapid Estimation for Parameterized Components in High-Level Synthesis," *IEEE Trans. on VLSI Systems*, Sep. 1993, pp. 296-303, vol. 1, No. 3, IEEE Computer Society, Washington, DC, USA.

Nayak et al., "Accurate Area and Delay Estimators for FPGAs," *Proc. of the IEEE Conference on Design, Automation and Test in Europe*, Mar. 4, 2002, pp. 862-869, IEEE, Piscataway, New Jersey, USA.

Shankar et al., "Annotation Methods and Application Abstractions," *Proc. of the 2007 IEEE International Conference on Portable Information*, May 25, 2007, IEEE, Piscataway, New Jersey, USA.

Shi et al., "A System Level Resource Estimation Tool for FPGAs," *Proc. of the 2004 International Conference of Field Programmable Logic and Applications*, Aug. 20, 2004, pp. 1-11.

Vootukuru et al., "Partitioning of Register Level Designs for Multi-FPGA Synthesis," *Proc. of the 1996 VHDL International Users Forum*, Spring 1996, pp. 99-106.

Xu et al., "Area and Timing Estimation for Lookup Table Based FPGAs," *Proc. of the 1996 European Design and Test Conference*, Mar. 11, 1996, pp. 151-157, IEEE, Piscataway, New Jersey, USA.

* cited by examiner

IC DESIGN ESTIMATION USING MID-LEVEL ELEMENTS OF IP CORES

FIELD OF THE INVENTION

The present invention relates generally to integrated circuits ("ICs"), and more particularly to estimating the performance or resource requirements of an IC design according to a selected parameter of a semiconductor intellectual property core used in the IC design.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Intellectual property cores are often used in IC designs, including IC designs loaded into an FPGA or other PLD. An intellectual property core is a well-defined circuit or component provided by a vendor or third party that a user incorporates into the IC design. An IP core typically has several parameters that a user can specify, but the user does not typically change the IP core. IP cores can be considered building blocks to be used in the IC design (circuit) that provide specific, and often complex, functionality. Examples of IP cores include finite impulse response ("FIR") filters, fast Fourier transforms ("FFTs"), and memory generators that allocate memory requirements to different physical memory arrays.

Rather than deriving an FIR filter from scratch, a circuit designer can load an FIR filter IP core into his IC design and specify the desired parameters for the FIR filter IP core, such as data bit width, coefficient bit width, number of filter taps, filter architecture, and sampling rate according to the user's intended function of the FIR filter in the IC design. An IC designer might want to know how an IP core parameter, such as the number of taps on an FIR filter, affects system performance, such as chip resources, power consumption, delay, clock rate, and latency.

However, understanding how the user-selected parameters of the IP core affect overall IC system performance is difficult because of the limited information that is available in conventional design tools. This type of information is conventionally provided to a designer in tabular form in documentation provided by the chip manufacturer or IP core supplier. Tables can be difficult to use because, after finding the correct table, the designer must accurately read the value from the correct row and column. Many parameters may be involved for complex IP cores, and table-based techniques can be error prone. For complex designs with large numbers of parameters, the number of parameter combinations can be in the millions, making it impractical to list the resources for all combinations.

For some IP cores, the vendor supplies fairly simple plots to help visualize how certain parameters affect resources. For example, the CORE GENERATOR tool available from XILINX, INC., of San Jose, Calif., provides plots to help visualize effects of parameters, such as resources versus latency in the floating point core. However, only a few parameters for a few resources are generally provided in graphical form.

Another technique is to run a complete tool flow (IC design implementation) for each parameter change, evaluating various selected parameter values against each other. Unfortunately, this is time consuming and can be very tedious for the designer, especially when a user wants to compare different sets of parameters, or when one parameter affects another.

It is desirable to estimate IC design performance according to selected parameters of an IP core in a manner that avoids the problems of the prior art.

SUMMARY OF THE INVENTION

A method of estimating a performance characteristic of an IC design having an IP core pre-characterizes an element type of the IC design to provide an estimation result of the element type. Mid-level elements of the IP are acquired. A user selects a value of a parameter of the IP core and a design tool is run on the IC design using the estimation result to model the mid-level elements of the IP core to return a performance value of the IC design.

DETAILED DESCRIPTION

Figure 1:
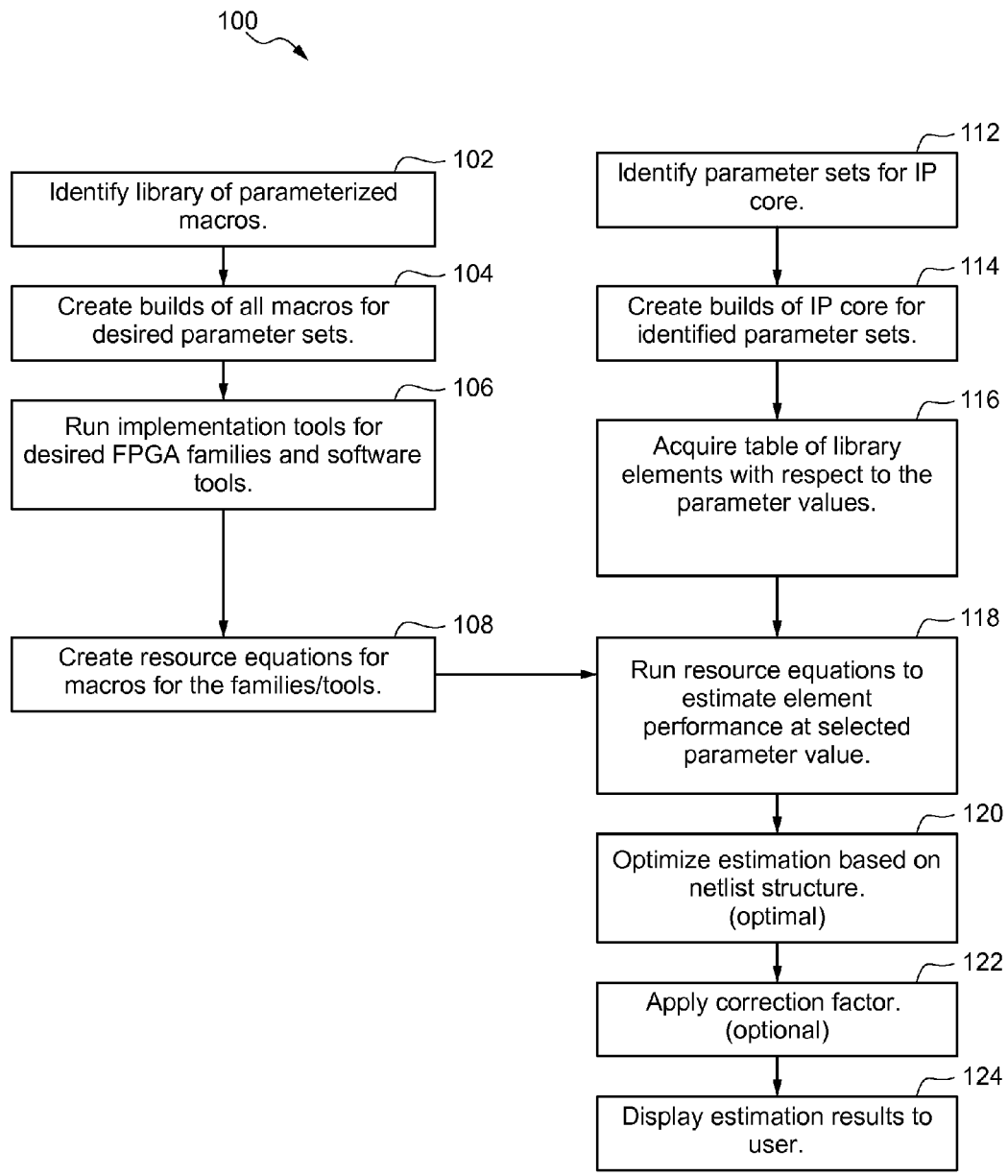
FIG. 1 is a flow chart of a method of estimating a performance characteristic of an IC design having an IP core according to an embodiment.

IP core performance is estimated and pre-characterized to produce a library of estimation calculations for various parameter sets. In particular embodiments, the estimations are applicable in a variety PLD platforms and families. Rather than performing the pre-characterization using low-level component modeling, such as modeling operation of look-up tables, block memory, registers, and flip-flops, pre-characterization is done using mid-level IP core component modeling, such as by modeling adders, comparators, registers, and multiplexers of the IP core when implemented in an IC or IC technology, such as in an FPGA.

An IP core can have several thousand lines of code written in a low-level language, such as register transfer level ("RTL") code. In an exemplary embodiment, a parser/elaborator, such as a hardware description language ("HDL")

parser, is used to take the low-level code, parse the lines of code to a library element (e.g., a mid-level component model), and elaborate the type of library element parsed. The parser/elaborator essentially takes the source code and generates a description, such as a schematic or netlist, of a well-defined library element, such as an adder, register, or memory.

Whereas estimating parameter sensitivity of IP cores using RTL-based techniques is technology specific, the characteristics of mid-level library elements are typically common across a family of ICs, such as across a family of FPGAs. In other words, once a library of mid-level elements has been characterized for a technology or device family, those library elements can be used to estimate IP core performance when the IP core is implemented in any one of the ICs within that technology or family. A library can also be used for estimation purposes across a multitude of different IP cores targeting that family since the library of mid-level components is defined by the parser/elaborator front-end, not the specific IP core. A mid-level element is a model of a component of an IP core expressed at a mid-level, rather than in low-level code.

If component libraries are established for different technologies or IC families, the performance of an IP core in one technology (e.g., a technology using eight-bit adders) can be compared to another technology (e.g., a technology using six-bit adders) in a quick, convenient fashion without having to run the entire design tool. This aids a designer in selecting the proper technology for his IC design by allowing him to evaluate the performance tradeoffs for different IP core parameters in different technologies, which often are priced differently, allowing the designer to maximize value. In some cases, a library is common across IC families, making it much easier to make comparisons given the same mid-level estimation. Another benefit is that the parser/elaborator only needs to run once for a given IP core and parameter set, and the resulting netlist can be used to estimate across IC families.

In some embodiments, computer-readable tables of IP core performance for various user-selected parameter values are established and stored in an element library. In alternative embodiments, resource equations are derived for elements of the IP core and stored in an element library. In some embodiments, a parameter range for the IP core parameter is set to include the expected minimum and maximum values. For example, if the IP core is a FIR filter, it is unlikely that the number of taps will be less than 1 or more than 1024 when the FIR filter is implemented in a VIRTEX-4 design technology. VIRTEX-4 design technology relates to a family of FPGA devices available from XILINX, INC. of San Jose, Calif.

A step size is chosen for the parameter range to provide a realistic number of data points to be used in a curve-fitting operation according to well-known curve fitting techniques. A resource equation is derived from the curve-fitting operation. The resource equation indicates how the performance of an element, such as latency, maximum clock speed, or chip resource requirements (e.g., logic or memory resources) varies according to the parameter value. For example, if performance of an element (e.g., memory generator) is known or expected to vary in a linear or near-linear fashion over the parameter range, only a few data points would be needed to derive a resource equation for that element. If performance of an element is not known, or known to be more complex, such as a FIR filter, then a greater number of data points are calculated to provide sufficiently accurate resource equations. For example, in one embodiment a large step size is assumed (e.g., a default step size providing two unique values for each parameter, the minimum expected value and the maximum expected value) for all parameters, and then divide by two until sufficient results are achieved, which would typically be a user-driven (manual) process, but could be automated given sufficient processing resources.

Resource equations provide accurate pre-characterization of IP core elements in IC platforms without having to implement all possible parameter values within a parameter range. For example, a resource equation provides performance values between selected parameter values that provide a sufficient number of data points. In other words, calculated performance values can be interpolated or extrapolated from the data points. Resource equations also provide a near-real-time estimation of IP core performance in an IC design that is very useful for comparing performance of the IP core versus selected parameter values. Resource equations can also be used to provide the parameter value necessary to obtain a desired performance or resource amount (e.g., specifying a 128-tap FIR filter in a VIRTEX-4 FPGA in less than 1,000 LUTs).

Curve fitting to a library of parameterized macros, which in turn have their own resource equations, is performed. In a particular application, macro parameters are curve-fit to the library macros (e.g., adders and registers) as well as the design parameters to the library macros. An example of a "parameterized macro" would be an adder with user-defined bit width and number of inputs (e.g., A+B or A+B+C). Developing resource equations of mid-level IC elements and parsing an IP core to identify library elements that can use the resource equations to predict performance provides better accuracy for the estimated structure and operation of the IC design. Also, rather than acquiring the breakdown (decomposition) of these library elements using intuition of the designer or algorithmic knowledge from a manual try-and-repeat process, using a parser/elaborator to extract the element components at a mid-level allows the element library to be developed in an automated fashion, such as by using scripts.

Using a parser/elaborator, such as an HDL parser, provides at least two benefits. It opens the technique to a large number of designs, tools, and methodologies, IP core designs, IC designs, and various high-level language (HLL) tools known to the art such as C-to-gates, since designs generated from HLL tools typically target RTL code as in intermediate step. Also, it allows for an automated approach requiring very little manual, design-specific intervention.

FIG. 1 is a flow chart of a method 100 of estimating a performance characteristic of an IC design having an IP core according to an embodiment. The method uses mid-level pre-characterization of an IC, IC family, technology, or software tools in combination with developing a library of elements of an IP core. An estimation result, such as a resource equation, which is an expression of hardware-specific mapping with regards to parameters of elements in the IC, are matched to circuit elements used in the IP core. The resource equations facilitate estimation of IP core performance and can provide a near real-time indication of how selected parameter values of the IP core affect IC performance.

In pre-characterization, a parameterized macro is identified (step 102). In some embodiments, many parameterized macros are identified and are included in a library of IC elements. The IC elements can be unique to an IC design, or can be common within a family of IC designs, such as common to a family of FPGAs, or can be unique to a software tool or common to a number of software tools. In some embodiments, the step of identifying the parameterized macro includes defining a parameter set, such as maximum and minimum expected or allowable values and the values in between. In other embodiments, several parameter sets are defined for an element, such as the adder example described above.

A build is created for the parameterized macro(s) to identify desired parameter sets for all macros (step 104). It is not necessary to create a build in all embodiments. If the implementation tools can be simultaneously run on multiple test cases, then the appropriate files are copied and modified according to the parameters of each test case. In another embodiment, the implementation tools are run for all desired families, software tools, and parameter sets. An implementation tool of the build is run (step 106), which produces performance results specific for the build (testcase). In a further embodiment, implementation tools for all builds of the desired elements of all target ICs (e.g., all types of FPGAs in a family/technology) are run. Alternative embodiments identify parameter sets one-at-a-time, all at once, or otherwise.

A resource estimation for the element is created (step 108). In a particular embodiment, the resource estimation is created by curve-fitting the parameters to the output of the build step to produce a resource equation. In an alternative embodiment, the resource estimation is a table of actual results with a fast table look-up procedure. In a further embodiment, resource estimations are created for a number of elements in an element library. In another embodiment, multiple resource estimations are created for an element according to a corresponding number of identified parameter sets for the element.

Estimation of the IP core resource requirements (i.e., IC design requirements) includes identifying a parameter set of the IP core (step 112). In a further embodiment, several parameter sets of the IP core are identified. In an exemplary embodiment, a user selectable parameter of the IP core is identified, and the desired or intended values or range of that parameter are defined according to an IC design that the IP core will be used in. Builds are created for the parameter set(s) (step 114).

A table or net list of library of elements for an IP core that includes the types of elements for which resource estimations, as described above with respect to step 108, have been created, is acquired (step 116). In a particular embodiment, a parser/elaborator is run on builds to acquire the table of library elements or netlist. Alternatively, the table or netlist is constructed from a pre-built location or in a piecemeal fashion from the parameter values.

In a further embodiment, the parser/elaborator acquires a table of a number of library elements with respect to the parameter values of a corresponding number of parameter sets. In a particular embodiment, the parser/elaborator is an HDL parser. In some embodiments, a table of library elements contains elements for additional IP cores that are used in the top-level core estimation. These additional library elements can be included in the estimation, or, if the resources required for these elements are already known, the resources can be directly accounted for in the eventual resource requirement.

The resource estimation is run for the IP core element at a selected parameter value of the IP core (step 118) to estimate one or more resource requirements, power consumption, throughput, or delay for operating the IP core at that parameter value. A further embodiment utilizes a netlist rather than a table of elements. A netlist typically includes information regarding how elements in the design are connected. This allows optimizations to be performed based on the structure of the design (step 120), rather than just its elements.

In a further embodiment, a core-specific offset is performed on the estimation. A core-specific offset can be empirically determined. For example, if a user finds, after pre-characterizing the core using the estimator, that the estimator is on average ~20% under-estimating that core across parameter sets, the user applies a correction factor to the estimation by multiplying the estimation results by an appropriate correction factor for that core (e.g., multiplying by 1.2) (step 122). This reduces the average estimation error.

In a particular embodiment, a user operating a design tool interfaces with a graphical user interface ("GUI") displaying the estimated design. As the user changes (i.e., selects) one or more parameter values of the IP core in an IC design, the design displayed on the GUI changes in near-real time, allowing the user to evaluate IC performance or resource requirements as a function of the selected parameter (step 124). The resource estimations provide accurate estimations of IC design and IP core operations without having to run the entire IC design or IP core using low-level IC elements.

Figure 2:
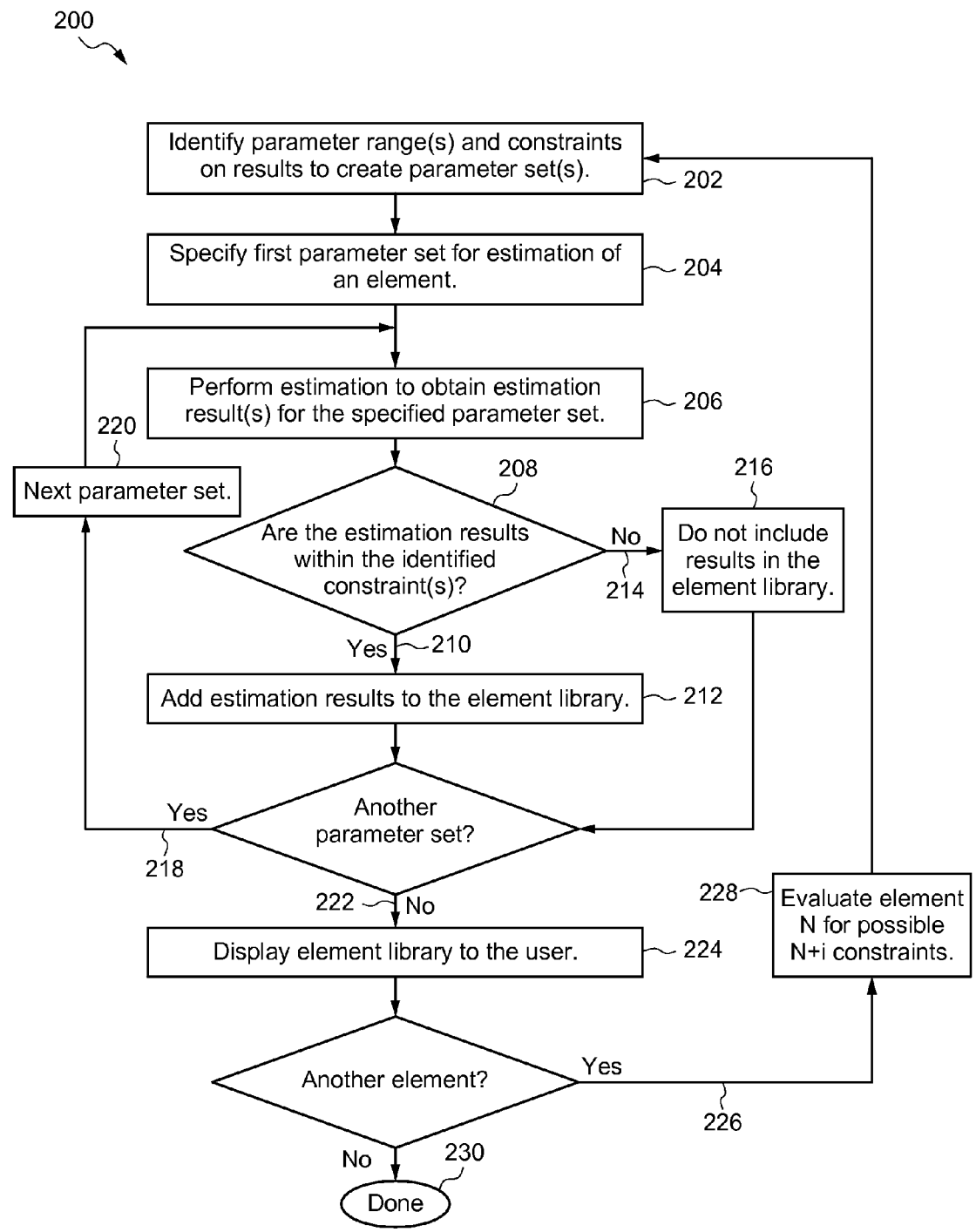
FIG. 2 is a flow chart of a method of developing an element library according to an embodiment.

FIG. 2 is a flow chart of a method of developing an element library according to an embodiment. Several estimations are run at different parameters to produce performance results that are compared with desired values, and the acceptable performance values are stored and displayed to the user. The user can choose the best parameter set for his design, or expand or narrow the parameter range(s) if too few or too many results are returned.

Parameter ranges and constraints on estimation results are identified to create parameter sets for an IP core or an element of an IP core (step 202). For example, if performance of an FIR is being estimated, the user might define the number of taps (which is typically one parameter of an FIR) to be between sixteen and sixty-four in a sixteen-bit IC architecture, or similarly restrict the number of stages in a FFT IP core. The user might also identify other parameters or constraints, such as a maximum number of LUTs to be used, in addition to the allowable range for the number of taps or stages.

A parameter set from step 202 is specified (selected) (step 204) and an estimation of the resources or performance is performed (step 206). "Performance characteristic" is the term used to commonly describe both resource requirements, such as the number of LUTs or performance, such as operational speed or power consumption. For example, the estimation may return values for device resources, power consumption, or operational speed. The estimation results are compared against constraints (step 208), and, if the estimation results are within acceptable limits (e.g., if a limit of 1000 LUTs was specified, and the estimation for the parameter set determines that less than 1000 LUTs will be required) (branch 210), the parameter set and associated estimation results are stored in (i.e., added to) an element library of the IP core (step 212).

If the estimation results are unacceptable (i.e., outside allowable limits) (branch 214), then the results are not added to the element library (step 216). This prevents unacceptable parameter sets from being presented to the user in a further step.

If additional parameter sets identified in step 202 have not yet been used in an estimation (branch 218), a next parameter set is specified (step 220), and the estimation loop is repeated. When all the parameter sets have been estimated (branch 222), the element library, which has estimation results associated with parameter sets, is provided to the user (step 224), such as by displaying the element library on an electronic display (see, FIG. 3, ref. num. 304).

In a further embodiment, additional elements are estimated (branch 226). In some embodiments inter-dependency of constraints across multiple elements or cores used in the same design arises. For example, a first element or core is defined as having a bit width of <=10 to achieve the desired size (i.e., chip resource requirement). In some embodiments, the bit width of the second core is similarly limited to <=10 so that the first and second core communicate with each other. The element is evaluated (step 228) to determine if the Nth element raises a new constraint for the Nth+1 or other subsequent element or core, and the new constraint is applied to the iteration of a subsequent element or core (e.g., in step 202). In an alternative embodiment, a total resource constraint for a number of multiple cores may be specified (e.g., a total maximum number of LUTs for all elements or cores). In an exemplary method, multiple iterations of the method of FIG. 2 are performed to insure inter-dependent constraints are accounted for. In other words, the method of FIG. 2 is repeated (revisited) for a previously estimated element.

If no additional elements are to be estimated, the process is done (step 230). The order of some steps may be changed. For example, additional elements are estimated and added to the element library before the element library is displayed to the user in an alternative embodiment. Typically, the estimation results and the associated parameters for multiple elements are stored in the element library for an IP core. The user might select to see the estimation results for only one element at a time, or to review the estimation results for several elements at once, to compare performance for several elements using the same, or a similar, parameter set.

The user can use the displayed element library in a number of ways. For example, he might quickly review the estimated results to see if there is a maximum or minimum, or which parameter set provides the best option for his IC design. Similarly, he might loosen the constraints (in step 208) or change allowable parameter values (in step 202) if few or no options for parameter sets are returned, or tighten constraints or parameter values if too many results are returned in the element library.

Figure 3:
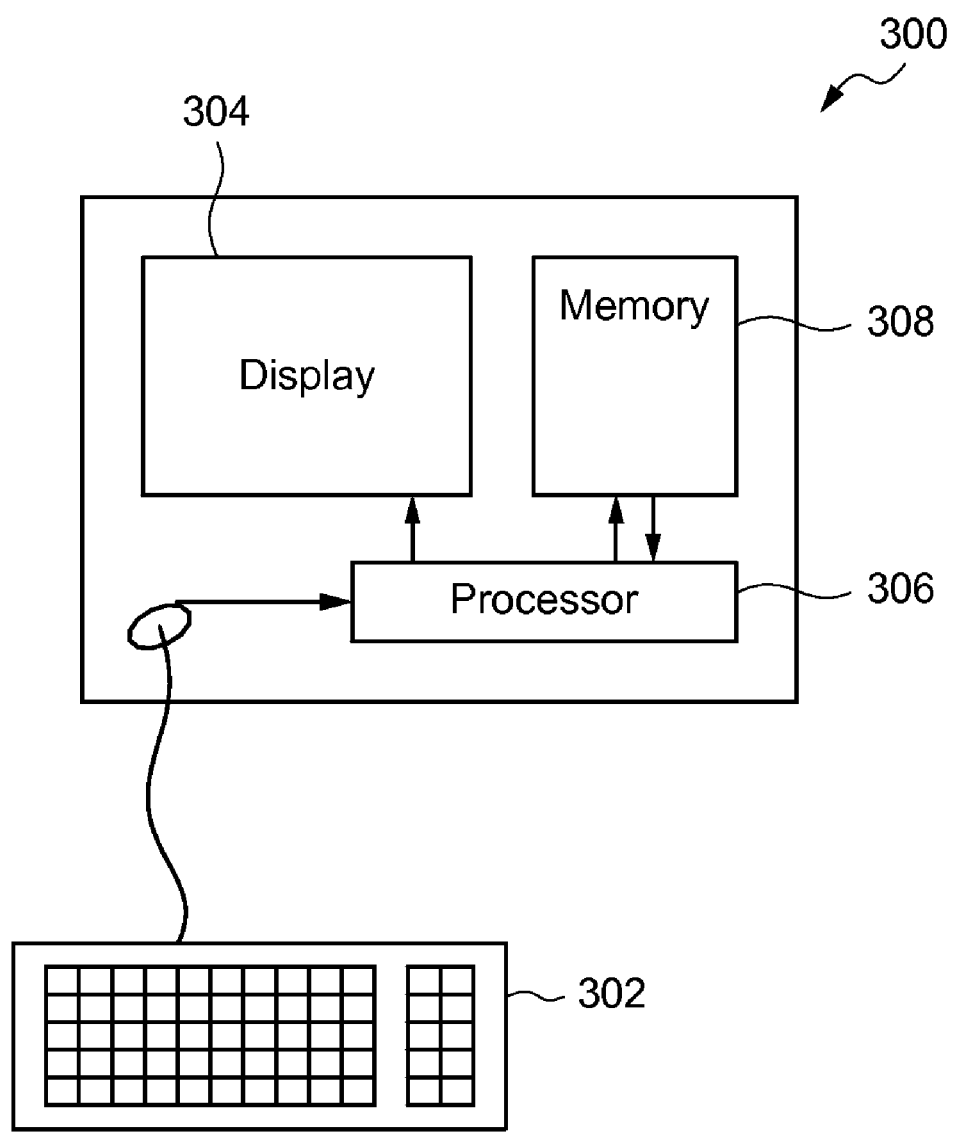
FIG. 3 is a diagram of an IC design implementation tool using a computer-readable medium according to an embodiment.

FIG. 3 is a diagram of an IC design implementation tool 300 using a computer-readable medium according to an embodiment. The design implementation tool includes a user input device 302, such as a keyboard or pointing device, a display 304, a processor 306 and memory 308. The memory is electronic or magnetic memory, such as computer instructions loaded into random access memory or stored on a magnetic disk, or is an optical disk, read-only memory, or any of several types or combinations of memory commonly known in the art of electronic computing devices. Although the memory 308 is shown within the design implementation tool, the memory is alternatively external, such as at a shared memory on a network or a server connected to the design implementation tool.

The memory contains computer-executable instructions for estimating design resources or design performance according to an embodiment or embodiments of the invention. In a particular embodiment, the memory contains computer-executable instructions for performing a method substantially in accordance with FIG. 1 or FIG. 2. In a further embodiment, the memory contains further computer-executable instructions for implementing an IC design in an IC chip. In a particular embodiment, the memory contains instructions for building an element library of the IC chip, creating resource estimations, such as equations and tables, for the library elements, parsing and elaborating an IP core defined in a low-level language to identify a mid-level element of the IP core corresponding to an element in the element library of the IC, and modeling the performance of the IC design using the resource estimation of the mid-level element.

Figure 4:
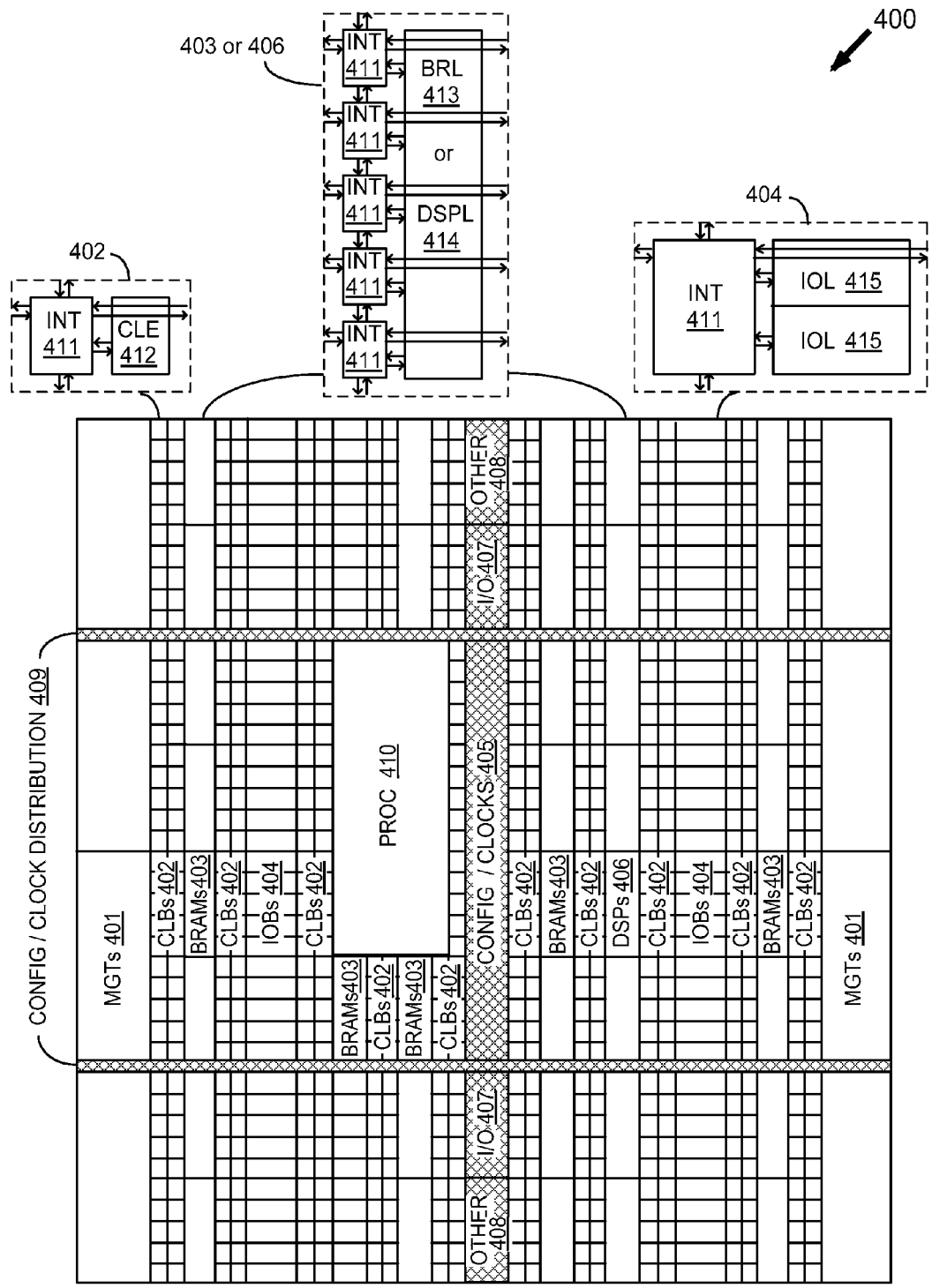
FIG. 4 is a plan view of an FPGA configured according to an embodiment.

FIG. 4 is a plan view of an FPGA 400 configured according to an embodiment. The FPGA includes CMOS portions in several of the functional blocks, such as in RAM and logic, and is fabricated using a CMOS fabrication process. The FPGA 400 includes an IP core with a user-selected parameter set according to a resource requirement or performance criterion estimated according to an embodiment. In a particular embodiment, the IP core is configured in the FPGA 400 having a parameter selected according to a resource or performance estimation using a parser/elaborator run on low-level code of the IP core identifying a mid-level element of the FPGA that is modeled using a resource estimation, such as a resource equation, that estimates the required resource or performance according to the parameter value.

The FPGA architecture includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415. In the pictured embodiment, a columnar area near the center of the die is used for configuration, clock, and other control logic.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, although specific embodiments are described in terms of specific methods of elaborating element lists and libraries, alternative embodiments apply. Therefore, the spirit and scope of the appended claims should not be limited to the foregoing description.

The invention claimed is:

1. A method of estimating a performance characteristic of integrated circuit (IC) designs having an intellectual property ("IP") core comprising:
    pre-characterizing element types of the IC designs to provide respective resource estimations of the element types;
    wherein each resource estimation indicates how performance of a mid-level element varies according to a user-selectable value of a parameter of the IP core, and the performance includes one or more of latency, maximum clock speed, IC resource requirements, power consumption, or throughput;
    acquiring mid-level elements of the IP core, each mid-level element being one of the element types;
    selecting a value of the parameter of the IP core;
    running a first IC design of the IC designs on a design tool using the resource estimations to model the mid-level elements of the IP core to return a first performance value of the first IC design; and
    running a second IC design of the IC designs on the design tool using the resource estimations to model the mid-level elements of the IP core to return a second performance value of the second IC design;
    wherein the first and second performance values indicate one or more of latency, maximum clock speed, IC resource requirements, power consumption, or throughput of the first and second IC designs, respectively; and
    the steps of acquiring and running are performed with a programmed processor.

2. The method of claim 1 wherein the step of acquiring the mid-level elements comprises parsing a low-level language model of the IP core to elaborate the mid-level elements of the IP core.

3. The method of claim 1 wherein the mid-level elements of the IP core are represented as a table or a netlist.

4. The method of claim 1 wherein the step of pre-characterizing the element types includes estimating results for the element types at a plurality of selected parameter values.

5. The method of claim 1 further comprising:
    storing the resource estimations in an element library of the IC design.

6. The method of claim 1 wherein the first IC design is a first type of field-programmable gate array and the second IC design is a second type of field-programmable gate array.

7. The method of claim 1 wherein at least one of the resource estimations is a resource equation.

8. The method of claim 7 wherein the resource equation is curve-fit to data obtained by estimating results for at least one of the element types at a plurality of selected parameter values.

9. The method of claim 1 wherein the step of pre-characterizing the element types further includes providing an element library including the element types and mapping the mid-level elements includes matching the mid-level element types to the element types in the library.

10. The method of claim 1 wherein the resource estimations of the element types are valid for a plurality of types of IC chips.

11. The method of claim 1 wherein the resource estimations of the element types are valid for the mid-level elements elaborated from a second type of IP core.

12. A computer-readable medium containing computer executable instructions for estimating performance of an integrated circuit (IC) design having an intellectual property ("IP") core according to the method of claim 1.

13. A system for estimating a performance characteristic of integrated circuit (IC) designs having an intellectual property ("IP") core, the system comprising:
    a memory;
    at least one processor coupled to the memory;
    wherein the memory is configured with respective resource estimations of the element types of the IC designs, and each resource estimation indicates how performance of a mid-level element varies according to a user-selectable value of a parameter of the IP core, and the performance includes one or more of latency, maximum clock speed, IC resource requirements, power consumption, or throughput;
    wherein the memory is further configured with instructions that when executed, cause the at least one processor to perform operations including:
        acquiring mid-level elements of the IP core, each mid-level element being one of the element types;
        selecting a value of the parameter of the IP core;
        running a first IC design of the IC designs on a design tool using the resource estimations to model the mid-level elements of the IP core to return a first performance value of the first IC design; and
        running a second IC design of the IC designs on the design tool using the resource estimations to model the mid-level elements of the IP core to return a second performance value of the second IC design;
    wherein the first and second performance values indicate one or more of latency, maximum clock speed, IC resource requirements, power consumption, or throughput of the first and second IC designs, respectively.

14. The system of claim 13 wherein the resource estimations of the element types include resource estimations of the element types at a plurality of selected parameter values.

15. The system of claim 13 wherein at least one of the resource estimations is a resource equation.

16. The system of claim 15 wherein the resource equation is curve-fit to data of estimated results for at least one of the element types at a plurality of selected parameter values.

17. The system of claim 1 wherein the resource estimations of the element types are valid for a plurality of types of IC chips.

18. The system of claim 1 wherein the resource estimations of the element types are valid for the mid-level elements elaborated from a second type of IP core.

* * * * *